United States Patent
Hsu

(10) Patent No.: US 7,339,795 B2
(45) Date of Patent: Mar. 4, 2008

(54) STRUCTURE FOR FASTENING A CIRCUIT BOARD ON A CASE

(75) Inventor: Cheng-Hua Hsu, Taipei (TW)

(73) Assignee: Lite-On Technology Corporation, Taipei (TW)

( * ) Notice: Subject to any disclaimer, the term of this patent is extended or adjusted under 35 U.S.C. 154(b) by 415 days.

(21) Appl. No.: 11/065,477

(22) Filed: Feb. 25, 2005

(65) Prior Publication Data
US 2006/0104040 A1   May 18, 2006

(30) Foreign Application Priority Data
Nov. 12, 2004   (TW) .............................. 93218163 U

(51) Int. Cl.
*H05K 1/18* (2006.01)
(52) U.S. Cl. .................... 361/762; 361/752; 361/753; 361/769; 174/350; 174/397; 248/637; 411/531; 470/49
(58) Field of Classification Search ........ 361/752–753, 361/762, 769; 174/350, 397; 411/531; 248/637; 470/49
See application file for complete search history.

(56) References Cited

U.S. PATENT DOCUMENTS

| | | | | |
|---|---|---|---|---|
| 2,393,505 A | * | 1/1946 | Riesing | .................. 267/141.2 |
| 3,311,210 A | * | 3/1967 | Peroni | ........................ 400/479 |
| 4,342,068 A | * | 7/1982 | Kling | .......................... 361/717 |
| 4,346,871 A | * | 8/1982 | Mauduit | ...................... 256/10 |
| 4,388,672 A | * | 6/1983 | Skill | ........................... 361/803 |
| 4,992,631 A | * | 2/1991 | Gee | ............................ 200/5 A |
| 5,372,560 A | * | 12/1994 | Chang | .......................... 482/54 |
| 5,800,022 A | * | 9/1998 | Del Rosario | ............. 301/5.306 |
| 6,005,773 A | * | 12/1999 | Rozman et al. | ............. 361/707 |
| 6,099,223 A | * | 8/2000 | Galis et al. | ................. 411/538 |
| 6,135,780 A | * | 10/2000 | Kelwaski et al. | ............. 439/57 |
| 6,618,953 B2 | * | 9/2003 | Izumi | .......................... 33/521 |
| 2002/0045944 A1 | * | 4/2002 | Muhanna et al. | ........ 623/17.16 |

* cited by examiner

*Primary Examiner*—Tuan T. Dinh
*Assistant Examiner*—Xiaoliang Chen
(74) *Attorney, Agent, or Firm*—Rosenberg, Klein & Lee

(57) ABSTRACT

A structure for fastening a circuit board on a case includes a strut which has one end coupled on the case and other end coupled on the circuit board, and a coupling member which has two distal ends with surfaces not parallel with each other. One distal end is coupled on the circuit board with the distal end surface in parallel with the other end surface of the strut, and the other distal end surface is parallel with a holding section of a fastening element which fastens the coupling member, the circuit board and the strut in this order, to make the circuit board in parallel with a mounting surface, which an electronic device may be held on, of the case. The circuit board is easy to be fastened even if the circuit board is not vertical to the molding direction of the fastening structure. Assembly costs also are lower.

12 Claims, 3 Drawing Sheets

STRUCTURE FOR FASTENING A CIRCUIT BOARD ON A CASE

FIELD OF THE INVENTION

The present invention relates to a structure for fastening a circuit board on a case adopted for use on electronic devices, and particularly to a structure for fastening a circuit board of an electronic device that is positioned not vertical to the molding direction of the fastening structure to facilitate assembly and reduce cost.

BACKGROUND OF THE INVENTION

With the Internet widely used these days information related products have become vary fashionable. After having gone through developments, the compact electronic notebook that helped people to manage daily tasks and record businesses has been gradually replaced by handheld electronic devices. These handheld electronic devices have become personal secretaries of hi-tech professionals and business people. And the mobile phone has almost become an indispensable personal feature.

The handheld electronic device is a palm size computer used as a personal digital assistant. Its functions have been enhanced and expanded from the original basic functions of a calendar, a to-do list, a notebook, and a communication directory to synchronous data transmission with computers now. Some even have various software installed to provide diversified applications such as an online Email receiving and transmission, a stock quotation and information browsing, an income and payment recording, an electronic book function, computer games, a spread sheet function, a database application, a household and community information, a wireless communication, and the like. When used properly, they provide even greater values to the users than the general personal assistants.

During synchronous transmission between a PDA and a computer, the PDA has to rely a docking station to establish a linking between the two. As the docking station usually has a circuit board located in a case to do data processing, the circuit board has to be fixedly positioned to couple a connector on the circuit board to another connector on the PDA for a transmission purpose. At present, fixing of the circuit board is accomplished by fastening the circuit board to the interior of the case of the docking station at a selected angle. In general when the circuit board and the docking station are formed in a vertical molding direction, assembly is easier. By contrast, if the circuit board and the docking station are formed not in a vertical molding direction, fastening and assembly is difficult. This assembly difficulty not only happens to the docking station of the PDA, it also happens to the docking stations of other electronic devices or electronic devices themselves.

SUMMARY OF THE INVENTION

In view of the aforesaid problems, the primary object of the present invention is to provide a structure for fastening a circuit board on a case, to facilitate assembly of the circuit board that is not vertical to the molding direction of the fastening structure, and to reduce costs.

In order to achieve the foregoing object, the fastening structure according to the invention includes a strut and a coupling member. The strut has one end coupled on a case and the other end coupled on a circuit board. The coupling member has two distal ends with surfaces not parallel with each other. The coupling member has a first distal end coupled on the circuit board and a second distal end with the surface in parallel with a holding section of a fastening element. The surface of the first distal end is parallel with the surface of other end of the strut. Through the fastening element, the coupling member, the circuit board and the strut may be fastened in this order, to couple the circuit board in parallel with a mounting surface of the case. An electronic device is installed on the mounting surface. Hence the invention enables the circuit board in the electronic device to be fastened and assembled easily, even if it is positioned not vertical to the molding direction of the fastening structure, and the assembly costs may be reduced.

The circuit board has apertures, each has an anchor trough on the lateral sides thereof. The coupling member includes an anchor lug corresponding to the anchor trough to facilitate soldering and anchoring. The anchor trough is formed in an l-shape, and the anchor lug also is formed in an l-shape. On the other hand, the circuit board may include anchor lugs while the coupling member includes an aperture. An anchor trough is formed on the lateral sides of the aperture, corresponding to the anchor lug, to facilitate soldering and anchoring. The anchor trough is formed in an l-shape, and the anchor lug also is formed in an l-shape.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
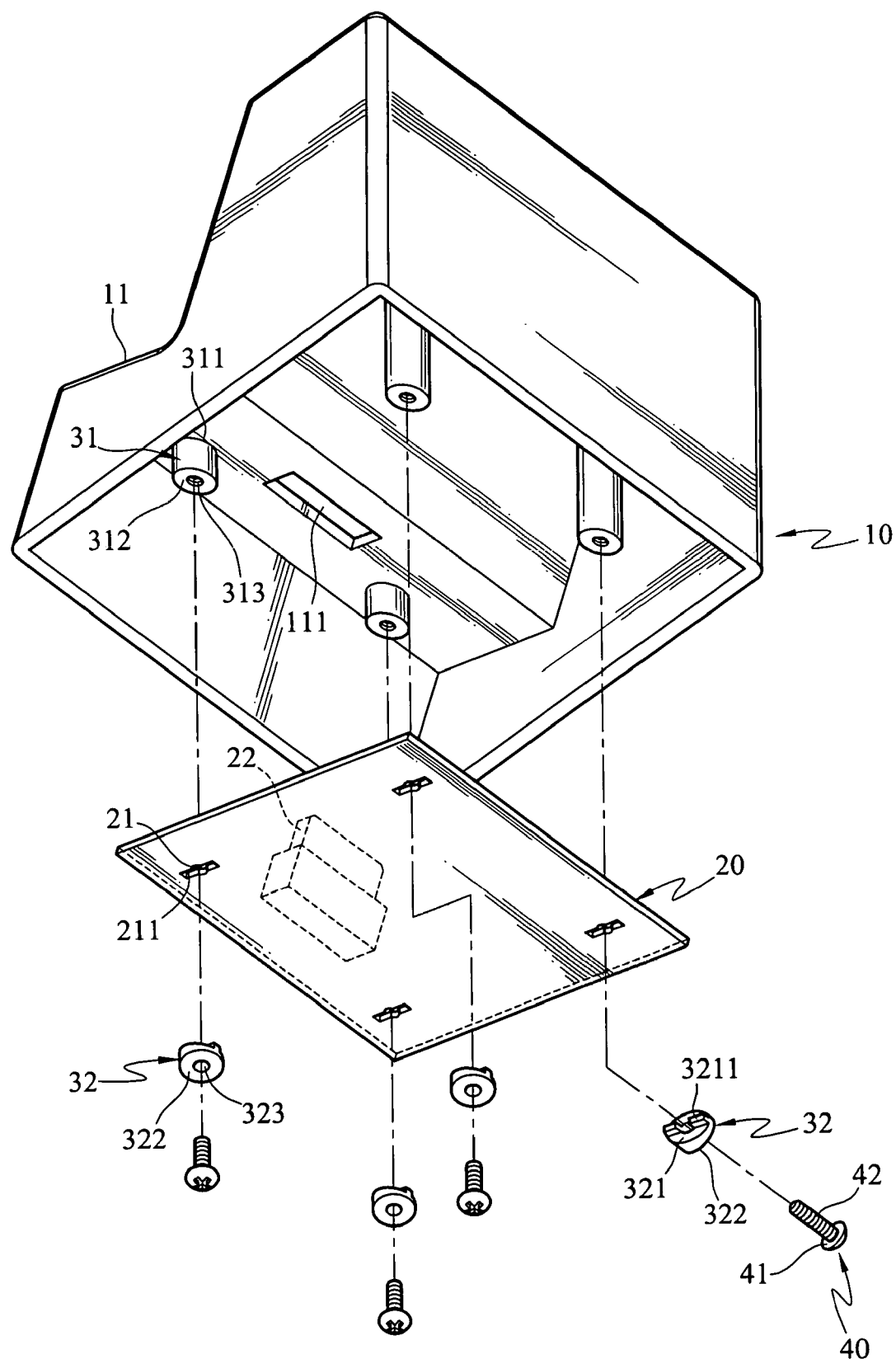
FIG. 1 is an exploded view of the invention.
Figure 2A:
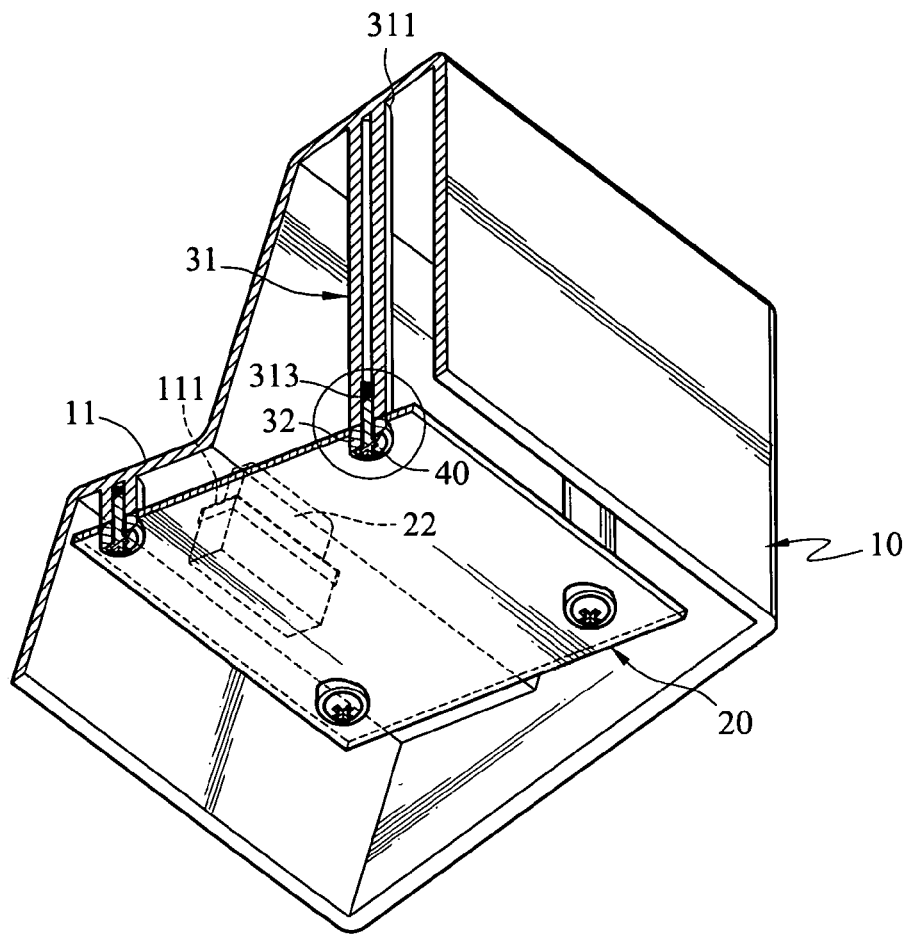
FIG. 2 is a sectional view of the invention.
Figure 2B:
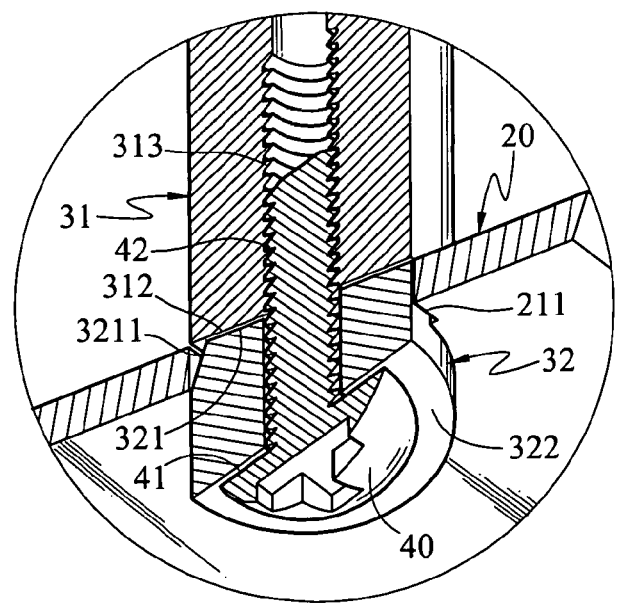
Figure 3:
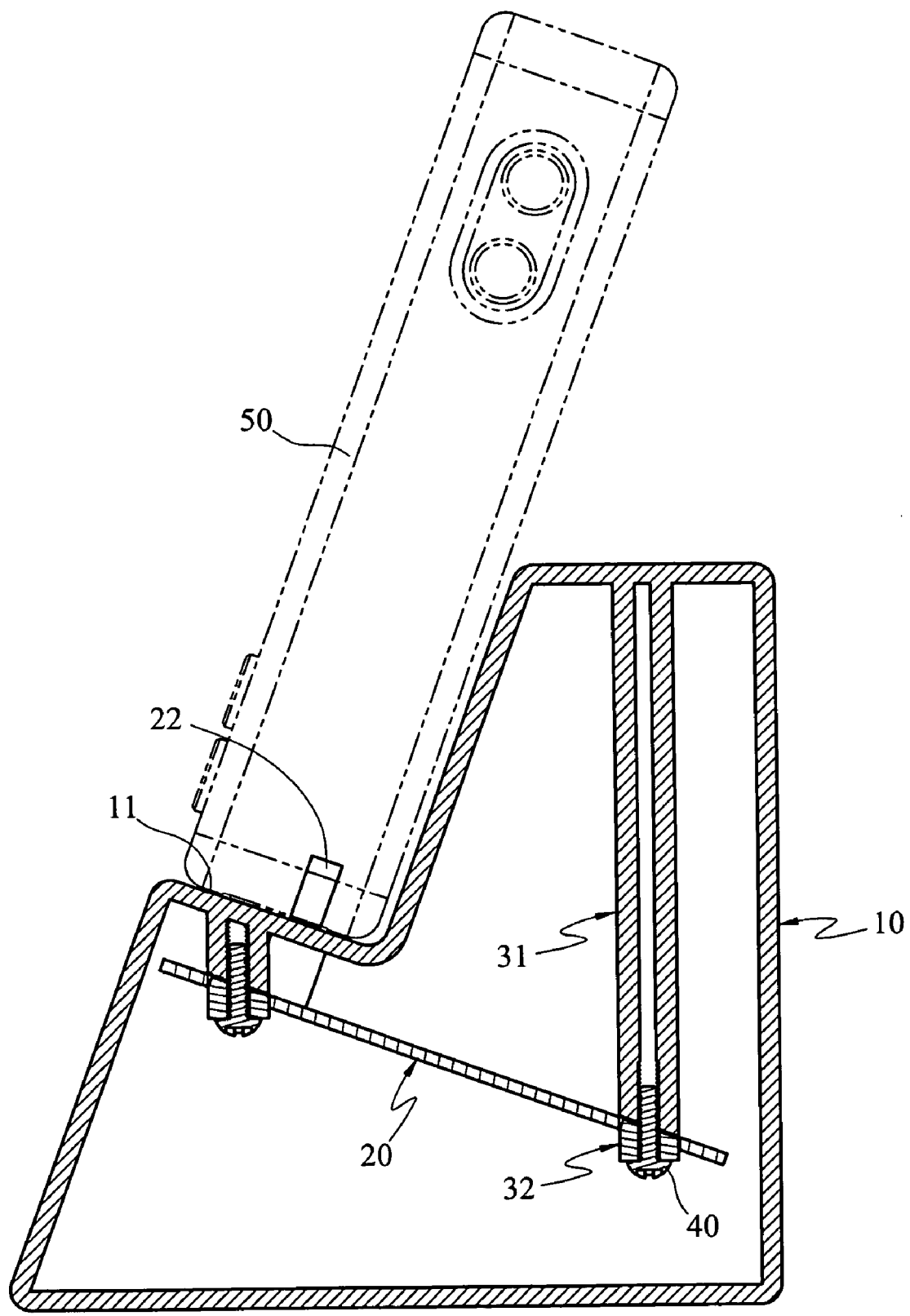
FIG. 3 is a schematic view of the invention in a use-condition.

Referring to FIGS. 1, 2 and 3, the structure for fastening a circuit board on a case according to the invention includes a strut 31 and a coupling member 32.

The strut 31 has one end 311 coupled on a case 10. The case 10 has an external mounting surface 11 for holding an electronic device 50. The mounting surface 11 has an opening 111.

The strut 31 has the other end 312 coupled on a circuit board 20. The circuit board 20 has apertures 21 and a connector 22. Each of the apertures 21 has an l-shape anchor trough 211 on the lateral sides. The connector 22 corresponds to and runs through the opening 111. The surface of one end 311 and the surface of the other end 312 of the strut 31 may be parallel or not parallel with each other. However, the surface of the other end 312 must be in parallel with the mounting surface 11 of the case 10. The strut 31 has a first internal screw thread 313 formed therein.

The coupling member 32 has two distal ends 321 and 322 that have respectively a surface not parallel with each other. The first distal end 321 is coupled on the circuit board 20 and has an l-shaped lug 3211 corresponding to the anchor trough 211 of the circuit board 20, to facilitate soldering and anchoring.

The second distal end 322 has a surface parallel with a holding section 41 of a fastening element 40. The first distal end 321 has a surface parallel with the surface of the other end 312 of the strut 31. The coupling member 32 has a second internal screw thread 323 mating the first internal screw thread 313 of the strut 31 to couple with an external screw thread 42 of the fastening element 40 to fasten the coupling member 32, circuit board 20 and the strut 31 in this order, so that the circuit board 20 is parallel with the mounting surface 11 of the case 10, and the connector 22 can run through the opening 111, to enable the electronic device 50 to be installed on the mounting surface 11.

For assembly, wedge the anchor lug 3211 of the coupling member 32 in the anchor trough 211 of the circuit board 20 and solder the coupling member 32 on the circuit board 20. Engage the external screw thread 42 of the fastening element 40 with the second internal screw thread 323 of the coupling member 32, the aperture 21 of the circuit board 20 and the first internal screw thread 313 of the strut 31 in this order, to fasten the coupling member 32, circuit board 20 and strut 31 together. The connector 22 on the circuit board 20 runs through the opening 111 of the case 10. The circuit board 20 is parallel with the mounting surface 11 of the case 10. And the electronic device 50 may be installed on the mounting surface 11.

Thus even if the circuit board 20 of the electronic device 50 is not vertical to the molding direction of the fastening structure of the invention, there is no difficulty in the assembly. Assembly is easier and the costs are lower.

Of course, the locations of the anchor trough 211 and the anchor lug 3211 mentioned above may be exchanged. Namely, the anchor trough 211 may be formed on the first distal end 321 of the coupling member 32, while the anchor lug 3211 is located on the circuit board 20, to couple the circuit board 20 with the coupling member 32.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A structure for fastening a circuit board on a case, comprising;
    a strut having one end that is coupled on the case and other end that is coupled on the circuit board; and
    a coupling member having a first distal end and a second distal end that have respectively a surface not parallel with each other, the first distal end being coupled on the circuit board, the surface of the second distal end being parallel with a holding section of a fastening element, the surface of the first distal end being parallel with the surface of the other end of the strut;
    wherein the fastening element fastens the coupling member, the circuit board and the strut in this order, to make the circuit board in parallel with a mounting surface of the case, the mounting surface holding an electronic device, the circuit board has an aperture which has an anchor trough on lateral sides thereof, the coupling member having an anchor lug corresponding to the anchor trough to facilitate soldering and anchoring.

2. The structure of claim 1, wherein the anchor trough is formed in an l-shape, and the anchor lug is formed in an l-shape.

3. The structure of claim 1, wherein the strut has a first surface on the one end not parallel with a second surface formed on the other end.

4. The structure of claim 1, wherein the strut has a first surface on the one end in parallel with a second surface formed on the other end.

5. The structure of claim 1, wherein the strut has a first internal screw thread formed therein, the coupling member having a second internal screw thread formed therein mating the first internal screw thread to be fastened by the fastening element.

6. The structure of claim 1, wherein the circuit board includes a connector, the case having an opening corresponding to the connector and allowing the connector to pass through.

7. A structure for fastening a circuit board on a case, comprising:
    a strut having one end that is coupled on the case and other end that is coupled on the circuit board; and
    a coupling member having a first distal end and a second distal end that have respectively a surface not parallel with each other, the first distal end being coupled on the circuit board, the surface of the second distal end being parallel with a holding section of a fastening element, the surface of the first distal end being parallel with the surface of the other end of the strut;
    wherein the fastening element fastens the coupling member, the circuit board and the strut in this order, to make the circuit board in parallel with a mounting surface of the case, the mounting surface holding an electronic device, the circuit board includes an anchor lug, the coupling member having an aperture which has an anchor trough on lateral sides thereof corresponding to the anchor lug to facilitate soldering and anchoring.

8. The structure of claim 7, wherein the anchor tough is formed in an l-shape, and the anchor lug is formed in an l-shape.

9. The structure of claim 7, wherein the strut has a first surface on the one end not parallel with a second surface formed on the other end.

10. The structure of claim 7, wherein the strut has a first surface on the one end in parallel with a second surface formed on the other end.

11. The structure of claim 7, wherein the strut has a first internal screw thread formed therein, the coupling member having a second internal screw thread formed therein mating the first internal screw thread to be fastened by the fastening element.

12. The structure of claim 7, wherein the circuit board includes a connector, the case having an opening corresponding to the connector and allowing the connector to pass through.

* * * * *